United States Patent [19]

Carbine

[11] 4,362,991
[45] Dec. 7, 1982

[54] INTEGRATED CIRCUIT TEST PROBE ASSEMBLY

[75] Inventor: Joseph C. Carbine, Wyncote, Pa.

[73] Assignee: Burroughs Corporation, Detroit, Mich.

[21] Appl. No.: 215,572

[22] Filed: Dec. 12, 1980

[51] Int. Cl.³ .................... G01R 1/06; G01R 31/02
[52] U.S. Cl. ........................ 324/158 P; 324/158 F
[58] Field of Search ............ 324/158 P, 158 F, 72.5, 324/73 PC, 73 AT

[56] References Cited

U.S. PATENT DOCUMENTS 3,787,768  1/1974  Kubota et al. ............... 324/158 F
4,195,258  3/1980  Yen ............................. 324/158 F Primary Examiner—Ernest F. Karlsen
Attorney, Agent, or Firm—Francis A. Varallo; Kevin R. Peterson; Edmund M. Chung

[57] ABSTRACT

The present disclosure describes a probe assembly for use in the testing of integrated circuits. More specifically, the probe assembly finds particular application in high density printed circuit board configurations of flat pack integrated circuit (IC) packages. The invention is characterized by its ability to be readily positioned in either coordinate axis, so as to access all of the IC packages regardless of their mounting position. The probe itself is designed to separate and insulate the IC package leads from one another. Moreover, the point of electrical contact of the probe on the leads is predetermined and reproducible. Finally, the probe automatically locks on to the desired IC leads and exerts a force thereon which is independent of that applied by the operator. Electrical and mechanical damage which might otherwise result to the printed circuit board and the IC package is virtually eliminated by the probe assembly.

9 Claims, 6 Drawing Figures

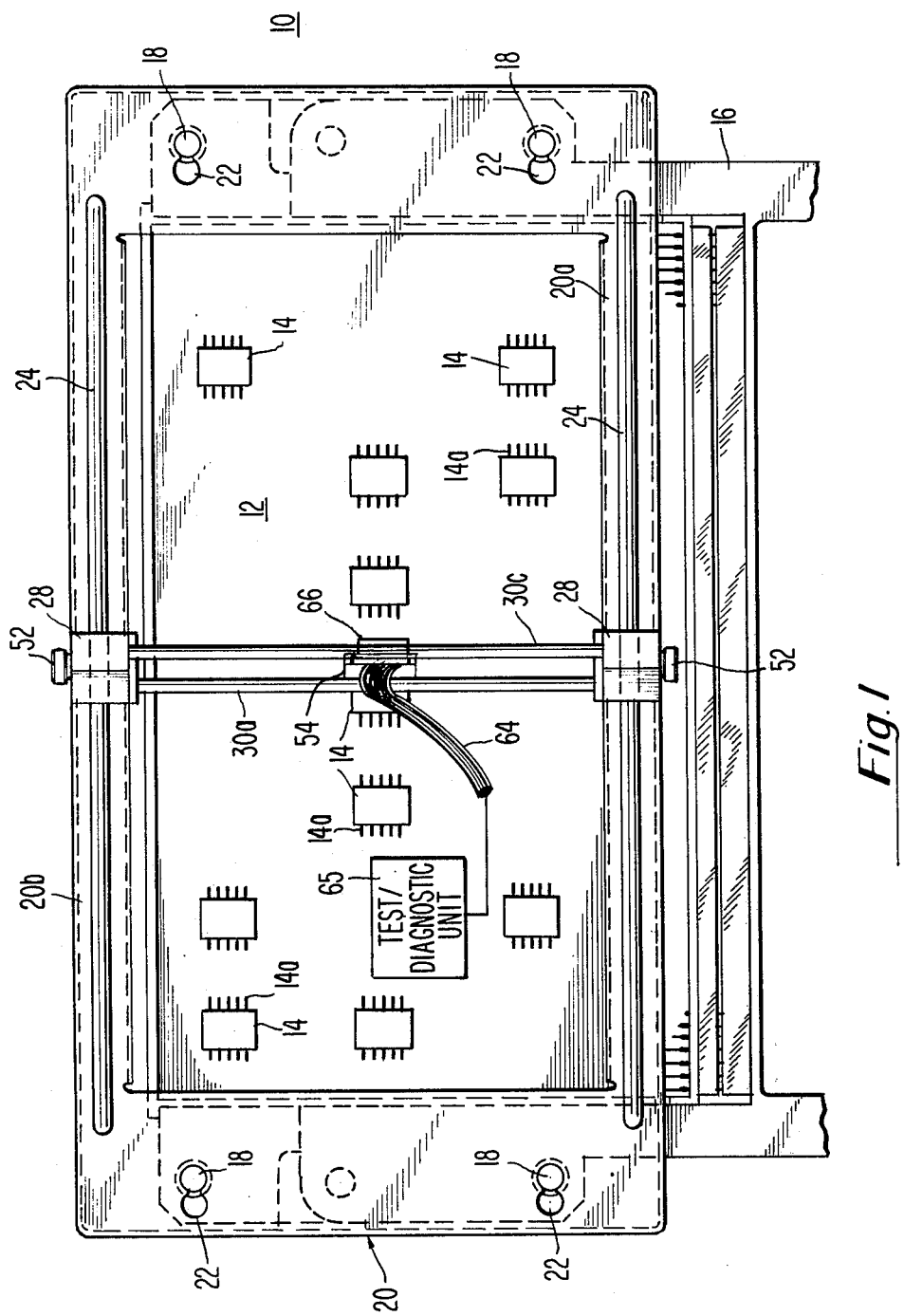

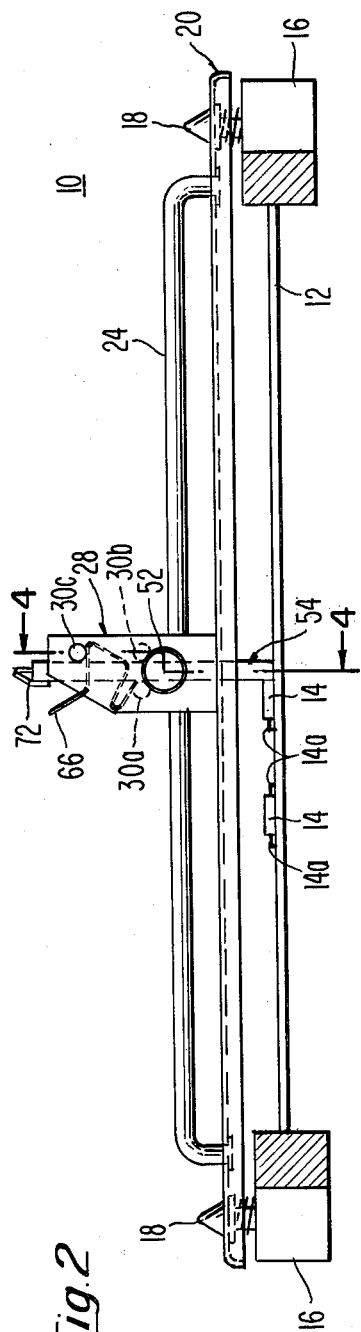
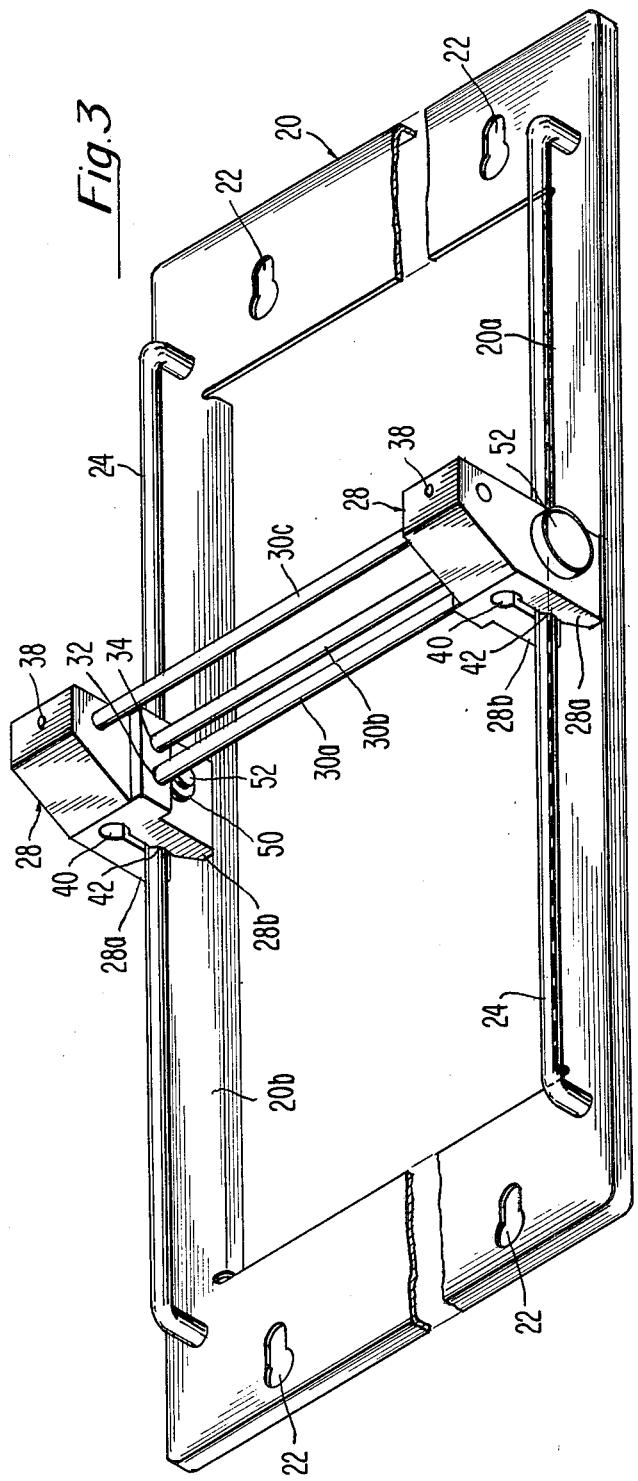

INTEGRATED CIRCUIT TEST PROBE ASSEMBLY

BACKGROUND OF THE INVENTION

The current use of multi-layer printed circuit boards with attendant high packaging densities has resulted in difficulties in the testing and diagnostic procedures associated with the completed board assemblies. For example, in an actual operative system, a large number of eight layer boards are utilized, each having many integrated circuit packages of the flat pack type. The latter have leads coming from the sides thereof and extending outward in substantially coplanar fashion with respect to the package surface. Normally, when installed, the leads extend outward a predetermined uniform distance, bend downward at right angles toward the board, and then extend a short distance parallel to the board. The last mentioned lead extremities are soldered to pads on the board. Because of the high density conditions, the printed circuit board pads are of minimal thickness and width. It is apparent that in contrast to the dual-in-line package which normally has leads disposed in apertures in the board and has mechanical rigidity, the flat pack depends upon the attachment of a narrow lead surface to a minimal pad area.

In the testing of completed printed circuit boards either immediately subsequent to fabrication or in the process of troubleshooting boards which have become defective during operation, the inter-board signals are available on input/output terminals associated with the board. Thus, no test problems are present since the terminals are readily accessed. However, in many situations, the intra-board signals which circulate exclusively within the board must be examined, and this presents some difficulty. One method of testing for the latter signals involves the soldering of the ends of individual wires to the respective points to be examined, such as the pads described previously. The other ends of the wires are then connected to test/diagnostic equipment. Such an operation requires that a highly skilled technician make the solder connections and be continuously available during testing. Moreover, since the wires between the board and the test equipment are relatively long, and the pad connections are tenuous at best, any accidental tugging of the wires may result in the pads being torn from the board surface. Since such boards are very expensive to fabricate, it is apparent that the test procedure may be counter-productive.

Another way of testing the intra-board signals, is to employ a typical hand held probe of the type used with oscilloscopes. Such a probe requires that the test technician exert extreme care to prevent the short circuiting of adjacent leads of the IC package. Additionally, if the probe is of the type that may be clipped to the lead, the same difficulty as noted hereinbefore with respect to damage to the board pads may be encountered. Finally, the use of such a probe does not permit the concurrent comparison of signals on adjacent leads of an IC package.

It is apparent that a need exists for a versatile, easy-to-use probe which completely eliminates the possibility of damage to the board or the IC packages. The present invention fills such a need.

SUMMARY OF THE INVENTION

The test probe assembly of the present invention is comprised of a probing frame and a pair of subassemblies, namely, the probe support and the test probe itself.

The probing frame is adapted to be removably mounted over the completed printed circuit board to be tested. It includes a pair of opposed planar sides having respective bars elevated from the surfaces thereof and oriented parallel thereto.

The probe support is designed to span the bars of the probing frame in orthogonal relation thereto and to be slidably mounted thereon. It is comprised of a pair of end blocks which engage the bars, and three parallel spaced-apart rods which are carried by the blocks. When the probe support subassembly is mounted on the probing frame, the forward rods, that is, those closest to the printed circuit board, are coplanar. The third or rearward rod lies in a plane parallel to that of the forward rods.

The test probe is carried by the last mentioned rods. It is comprised of a body and a cover made of insulative material. The forward body extremity which is adapted to contact the printed circuit board during probing, includes a plurality of spaced apart tooth-like projections. Probe contacts of the spring-actuated plunger type such as the POGO contacts manufactured by Pylon, Inc. are mounted in the test probe body and their tips appear externally between respective adjacent ones of the last mentioned projections. Wires connected to the respective POGO contacts within the body, exit the latter at the opposite or rearward extremity thereof, where they may be connected to test and diagnostic equipment. The test probe also includes a unitary spring member having a complex geometry within a generally U-shaped configuration. The test probe body is inserted between the forward rods of the probe support and rests upon the rearward rod.

In the probing operation, the probe support is first positioned in one axis (for example, the Y-axis) and the test probe is then oriented in the orthogonal axis (the X-axis) with respect to the IC package having signals to be examined. The edge of the test probe body planar surface is visually aligned with the edge of the IC package planar surface. As the operator pushes the test probe toward the printed circuit board, the tooth-like projections of the probe body contact the board surface. Concurrently, the spring member locks on the rearward bar, thereby preventing the probe from being withdrawn from contact with the package leads. The tooth-like projections separate and insulate the leads from one another. The probe body dimensions are such that the POGO contacts engage the respective leads at their points of maximum strength, that is, just before they are bent toward the printed circuit board. Pressure on the leads is limited by contact of the probe body projections with the board and is solely a function of the spring pressures exerted by the POGO contacts.

Other features and advantages of the present invention will become apparent in the detailed description of the invention which follows.

BRIEF DESCRIPTION OF THE DRAWING

FIG. 1 is a plan view of the test probe assembly of the present invention.

FIG. 2 is a side view of the probe assembly.

FIG. 3 is a pictorial illustration of the probe assembly providing additional details of the probing frame and the probe support.

DESCRIPTION OF THE PREFERRED EMBODIMENT

Figure 5:
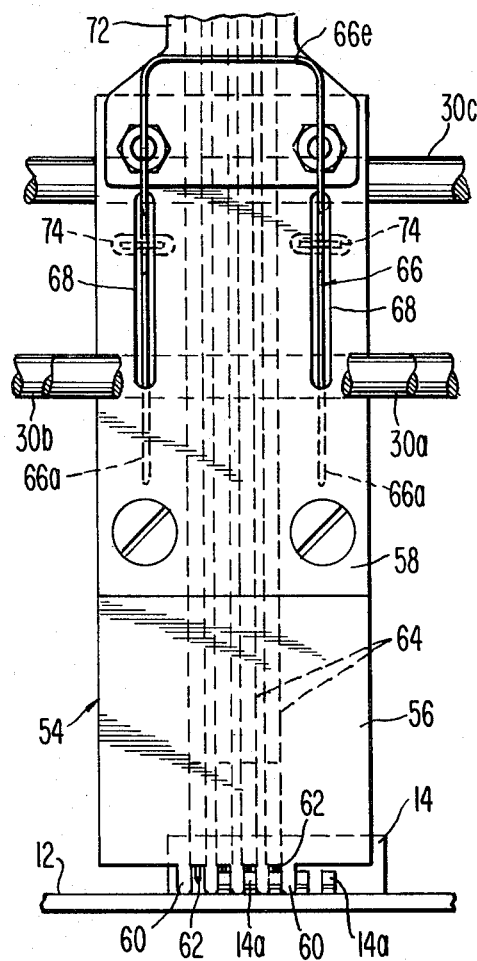
FIG. 5 is a plan view of the components which make up the test probe, as seen in an operational environment.

With reference to FIGS. 1 and 2 there is illustrated in plan and side views respectively, the test probe assembly 10 of the present invention.

The printed circuit board 12 having a plurality of integrated circuit flat packs 14 with leads 14a to be probed is mounted in a fixture 16. The fixture includes a plurality of pins 18 each with a conical head and a spring loaded disc for mounting the probing frame 20. The latter has a plurality of keyhole shaped slots 22 homologously positioned with respect to the fixture pins 18, for receiving the conical heads and being seated against the discs.

With additional reference to the pictorial illustration of FIG. 3, the probing frame 20 includes a pair of bars 24 elevated from, and extending parallel to, the respective longitudinal planar sides 20a and 20b of the frame 20. The extremities of each bar 24 are bent at right angles and affixed to the frame 20.

As seen in FIGS. 1-3 inclusive, the probe support 26 spans the bars 24 of the probing frame 20 in orthogonal relationship with the former. It is comprised of a pair of end blocks 28 holding three rods 30a, 30b and 30c. With additional reference to FIG. 4, rods 30a and 30b which are substantially centrally disposed with respect to the longitudinal axis of the end blocks 28 are loosely fitted into apertures 32 and 34. Rod 30c which is located near one extremity of the end blocks 28 is loosely fitted into bores 36 and secured therein by pins 38. The opposite extremity of each end block is formed into two leg sections 28a and 28b by virtue of a pair of apertures 40 and 42 connected to each other by a slot 44. A bore 46 and a counterbore 48 oriented transverse to slot 44 is provided. The counterbore 48 accommodates a threaded sleeve 50, which is adapted to receive the extremity of a thumbscrew 52, introduced into the block 28 via bore 46.

In assembling the probe support 26 to the probing frame 20, the thumbscrews 52 are loosened, and the end blocks 28 are pressed onto the bars 24, which enter the apertures 42. Entrance to the apertures 42 is facilitated by the sloped surfaces at the extremities of legs 28a and 28b. The probe support may now be moved along bars 24 from one end of the probing frame 20 to the other. As will be described in greater detail hereinafter in connection with the operation of the probe assembly 10, when the probe support 26 is positioned at a desired location, the thumbscrews 52 are tightened. This action draws legs 28a and 28b closer together, making apertures 42 smaller and preventing any further movement of the probe support 26. As mentioned hereinbefore, the rods 30a, 30b and 30c are loosely fitted into the end blocks 28. This tolerance permits operation of the probe support 26 with bars 24 in the probing frame 20 which have become somewhat distorted or non-parallel with respect to each other during prolonged use.

Figure 4:
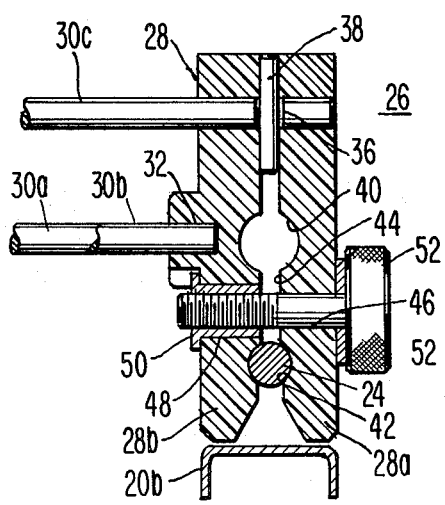
FIG. 4 is a section view of the probe support members taken along lines 4—4 of FIG. 2.

The test probe 54 itself as seen in detail in FIGS. 4 and 5, is loosely positioned in the probe support 26. The test probe 54 is comprised of a body 56 and a cover 58 made of insulative material. The forward body extremity of test probe 54 includes a plurality of tooth-like projections 60. Mounted in the test probe body and oriented between adjacent ones of the last mentioned projection 60 are a plurality of spring-actuated plunger type contacts 62. Wires 64 connected to the respective contacts 62 within the test probe body exit the latter at the rearward extremity thereof, where they may be electrically connected to a Test/Diagnostic unit 65 (FIG. 1). A unitary spring member 66 is also disposed in the test probe body 54. The spring member 66 has a generally U-shaped configuration. The open ends 66a of the spring 66 are affixed within the test probe body 56 in substantial planar relationship therewith. The succeeding portions of the spring member include hairpin loops 66b which angularly protrude through slots 68 in the surface of the probe cover 58, return through the probe body to produce a sloped portion 66c protruding through slots 70 in the surface thereof. The next spring sections 66d reenter the probe body 56 at right angles thereto, exit the other side of the body, and then angle rearward in a comparatively large rectangular loop 66e. A substantially planar metallic section 72 fastened to the rearward extremity of the test probe provides a finger grip for manipulating the probe into operating position, and securing the wires 64. The forward extremity of the test probe 54 may be inserted between rods 30a and 30b of the probe support and rested upon the rod 30c. At this point, the probe 54 is not locked within the probe support 26 and may be visually positioned at any point across the printed circuit board 12.

Figure 6:
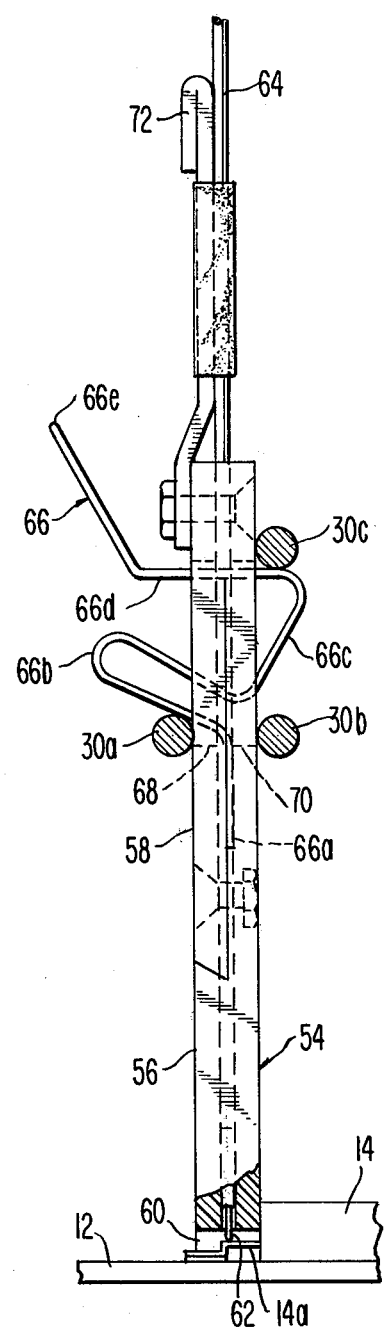
FIG. 6 is a side view of the test probe.

With general reference to FIG. 1 and more specific reference to FIGS. 5 and 6, the function of test probe assembly 10 on an operational printed circuit board will now be considered. The probe support 26 is slid along the length of the bars 24 and visually aligned with the leads 14a of the IC flat pack 14 to be tested. Sighting of the leads 14a is conveniently made by using rods 30a and 30b of the probe support as a reference. At this point, thumbscrews 52 are tightened to avoid any further movement of the probe support 26. If the test probe 54 is not already loosely carried, it may be inserted therebetween at this time and moved crosswise above the printed circuit board 12 to the location of the desired flat pack 14. When it has been determined which of the flat pack leads 14a are to be engaged by the probe contacts 62, the forward edge of the probe body 56 is aligned with the edge of the IC flat pack 14. The probe body 56 is then pushed toward the printed circuit board 12 by finger pressure on section 72 thereof. The tooth-like projections 60 on the forward extremity of the probe body 54 will lie between the IC leads 14a and contacts 62 will engage the latter. As the projections 60 move into contact with the surface of the printed circuit board 12, the angled portion 66c of the spring member 66 is pushed toward the body 56 of the probe by rod 30c, in opposition to the pressure of spring loop 66b; and as contact with the board 12 is made, rod 30c is locked between spring section 66d and the probe body 54—spring section 66c returning to its rest position. Should the probe body 56 not be perfectly oriented at right angles to the printed circuit board 12, the thumbscrews 52 may be loosened slightly and the probe support 26 moved until the desired orientation is achieved.

As implied hereinbefore, the flat pack leads 14a are bent in a fixture to insure uniformity of the length of the lead between the flat pack body and the right angle bend. The distance between the probe body 56 and the center of the contacts 62 is chosen such that the leads 14a are engaged at points just before the last mentioned bend. These points represent rigid areas which may be contacted repeatedly without becoming deformed. It is apparent that if the leads 14a are bent or otherwise deformed, repeated test signal results may be inconsistent. The probe 54 may be released from its locked position by lifting the loop 66e of spring member 66 away from the probe body 56 thereby pulling section 66c back into the probe body and freeing rod 30c. Retaining pin members 74 positioned across the slots 70 in body 56 prevent spring 66 from being pulled completely out of the probe body during the release action.

In conclusion, there has been disclosed a test probe assembly well suited for the testing of integrated circuit packages. It should be apparent that depending upon the particular application, changes and modifications of the connector may be required. Such changes and modifications insofar as they are not departures from the true scope of the invention are intended to be covered by the following claims.

What is claimed is:

1. An integrated circuit test probe assembly for probing selected leads of operational integrated circuit packages mounted on an interconnection medium comprising in combination:
    a probing frame removably mounted over said interconnection medium, said frame including a pair of opposed planar sides having respective bars elevated from the surfaces thereof and oriented parallel thereto,
    a probe support slidably mounted in one rectangular coordinate axis on said bars of said probing frame and oriented in orthogonal relation thereto, said probe support comprising a pair of end blocks for engaging the respective pair of bars of said probing frame and a plurality of parallel spaced-apart rods, each of said rods having its opposite extremities supported by the respective pair of end blocks,
    a test probe adapted to be carried by said rods of said probe support and being movable above said interconnection medium in the opposite rectangular coordinate axis, said test probe comprising a body and a cover therefor, said body including a plurality of spaced-apart tooth-like projections at its forward extremity, a plurality of spring-actuated plunger type contacts mounted in said body and protruding externally thereof between respective adjacent ones of said tooth-like projections, a plurality of electrical conductors each having an extremity connected to one of said plurality of contacts and its opposite extremity external to said body, a spring member attached within said body, a plurality of slots in said body and said cover for permitting portions of said spring member to appear externally thereto,
    said test probe being further adapted to be moved toward said selected leads of an integrated circuit package in a direction substantially orthogonal to the surface of said interconnection medium, said contacts engaging said selected leads and said tooth-like projections separating and insulating the latter from one another, said spring member causing said body of said test probe to be locked onto one of said rods of said probe support in substantial concurrence with the attainment of contact of said tooth-like projections with said surface of said interconnection medium.

2. A test probe assembly as defined in claim 1 further characterized in that the end blocks each include a pair of apertures substantially centrally disposed with respect to its longitudinal axis for loosely receiving the respective opposite extremities of a first and a second of said plurality of rods, said end blocks each further having a third aperture adjacent one extremity thereof for loosely holding the extremities of a third of said plurality of rods, the first and second of said rods being coplanar in one axis and said second and third of said rods being coplanar in an axis orthogonal to the former.

3. A test probe assembly as defined in claim 2 further characterized in that each of said end blocks includes at its other extremity a pair of longitudinally disposed spaced-apart openings connected to each other by a slotted region and oriented in a direction parallel to that of said bars of said support frame, said last mentioned extremity being thereby formed into two leg sections, a bore and a counterbore oriented substantially transverse to said pair of spaced apart openings and disposed in said slotted region, a threaded sleeve mounted within said counterbore, and a thumbscrew for engaging said sleeve via said bore, the one of said openings in proximity to the extremities of said leg sections engaging a bar of said support frame.

4. A test probe assembly as defined in claim 3 further characterized in that said spring member is of unitary construction having a generally U-shaped geometry, the open ends of said spring member being affixed within said body of said test probe in substantial planar relationship therewith, said spring member having succeeding adjacent symmetrical portions which include hairpin loops angularly protruding through said slots in said cover, sloped portions protruding through said slots in one surface of said body, straight portions commencing external to the last mentioned surface and exiting through said last mentioned slots in said cover and angled portions terminating in a common rectangular loop, said test probe being locked in position during the probing operation by virtue of the disposition of said third of said plurality of rods of said probe support behind said straight portions of said spring member.

5. A test probe assembly as defined in claim 4 further including a substantially planar section fastened to the rearward extremity of said test probe for providing a finger grip for manipulating the test probe into operating position.

6. A test probe assembly as defined in claim 5 further characterized in that said interconnection medium is a printed circuit board and that said integrated circuit packages are of the flat pack type.

7. A test probe assembly as defined in claim 6 wherein the length of the leads measured between the edge of the flat pack and the right angle bend toward the printed circuit board is uniform, the distance between the edge of the body of said test probe and the center of said contacts being chosen such that said leads may be repeatedly engaged at a point just prior to said bend.

8. A test probe assembly as defined in claim 7 wherein said body and said cover of said test probe are formed of insulative material.

9. A test probe assembly as defined in claim 8 further including a fixture for holding said printed circuit board, said fixture having a plurality of pins, each pin having a conical head and a spring loaded disc, said probing frame having a plurality of keyhole shaped slots homologously positioned with respect to said pins for receiving the conical heads and for being seated against the discs thereof.

* * * * *